US007385823B1

(12) United States Patent
Desrosiers et al.

(10) Patent No.: US 7,385,823 B1
(45) Date of Patent: Jun. 10, 2008

(54) RETENTION MODULE FOR A HEAT DISSIPATION ASSEMBLY

(75) Inventors: Norman B. Desrosiers, Oxford, NC (US); Michael D. French, Jr., Raleigh, NC (US); Dean F. Herring, Youngsville, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/746,580

(22) Filed: May 9, 2007

(51) Int. Cl.
*H05K 7/20* (2006.01)
*F28D 15/00* (2006.01)

(52) U.S. Cl. .................... 361/710; 361/704; 361/709; 361/719; 165/104.33; 165/185; 248/510

(58) Field of Classification Search ................ 361/704, 361/709–710, 719; 165/80.3, 104.33, 185; 174/16.3; 248/505, 510; 439/487
See application file for complete search history.

(56) References Cited

U.S. PATENT DOCUMENTS

| 5,448,449 | A | 9/1995 | Bright et al. |
| 6,735,085 | B2 | 5/2004 | McHugh et al. |
| 6,905,357 | B2 | 6/2005 | Ma |
| 7,009,844 | B2 | 3/2006 | Farrow et al. |
| 7,035,107 | B2 * | 4/2006 | Eckblad et al. ............. 361/719 |
| 7,090,519 | B2 * | 8/2006 | Muramatsu et al. ........ 439/159 |
| 7,133,285 | B2 * | 11/2006 | Nishimura .................. 361/715 |
| 7,283,362 | B2 * | 10/2007 | Lin et al. .................... 361/704 |
| 2004/0032720 | A1 | 2/2004 | McHugh et al. |
| 2005/0117306 | A1 | 6/2005 | Lee et al. |
| 2006/0018097 | A1 | 1/2006 | Lee et al. |
| 2006/0203452 | A1 | 9/2006 | Barina et al. |
| 2007/0127214 | A1 * | 6/2007 | Chen .......................... 361/709 |

FOREIGN PATENT DOCUMENTS

JP     2006324470 A   * 11/2006

* cited by examiner

Primary Examiner—Jayprakash N Gandhi
Assistant Examiner—Robert J Hoffberg
(74) Attorney, Agent, or Firm—Sawyer Law Group LLP

(57) ABSTRACT

A retention module for a heat dissipation assembly is disclosed. In a first embodiment, the retention module may include a frame having an external member and an internal member enclosed within the external member. Furthermore, the internal member is adaptable to seat a heat sink. Additionally, a lever is coupled to the external member, wherein the lever includes a cam. When the lever engages in a first position, the cam pushes the internal member forward to engage the heat sink to a surface. Through the use of the retention module described above, a retention module may be used as a simple method to load and lock heat sinks of varying sizes within a heat dissipation assembly.

22 Claims, 4 Drawing Sheets

RETENTION MODULE FOR A HEAT DISSIPATION ASSEMBLY

FIELD OF THE INVENTION

The present invention relates generally to a heat dissipation assembly and more particularly to a retention module within a heat dissipation assembly.

BACKGROUND OF THE INVENTION

For the last few decades, computer technology has continued to advance. Thus, electronic components such as central processing units (CPUs) of computers have been designed to provide faster operational speed and greater functional capabilities to adequately facilitate the advancement of computer technology. When a CPU operates at high speeds within a computing system, the rate at which the CPU generates heat increases significantly. It is therefore necessary to dissipate the heat from the computing system quickly, for example, by attaching a heat sink to the CPU within a computing enclosure. The heat sink may allow a CPU and other electronic components within the enclosure to operate at maximum speeds while maintaining moderate temperatures, thereby retaining the functional integrity of the CPU.

Generally, a retention module is utilized to mount a heat sink to a CPU within a computing enclosure. Typically, a retention module includes a plurality of clips, wires, and locking and retaining members. The aforementioned features as used in the prior art is labor intensive for a user when loading and locking a heat sink upon a retention module.

Therefore, what is needed is a retention module within a heat dissipation assembly that overcomes the aforementioned limitations.

BRIEF SUMMARY

A retention module for a heat dissipation assembly is disclosed. In a first embodiment, the retention module may include a frame having an external member and an internal member enclosed within the external member. Furthermore, the internal member is adaptable to seat a heat sink. Additionally, a lever is coupled to the external member, wherein the lever includes a cam member. When the lever engages in a first position, the cam member pushes the internal member forward to engage the heat sink to a surface.

Through the use of the retention module described above, a retention module may be used as a simple method to load and lock heat sinks of varying sizes within a heat dissipation assembly.

BRIEF DESCRIPTION OF SEVERAL VIEWS OF THE DRAWINGS

The present embodiment is illustrated by way of example and not limitation in the figures of the accompanying drawings, in while like references indicate similar elements, and in which.

DETAILED DESCRIPTION OF THE DRAWINGS

The present invention relates generally to a heat dissipation assembly and more specifically to a retention module within a heat dissipation assembly. The following description is presented to enable one having ordinary skill in the art to make and use the embodiment and is provided in the context of a patent application and the generic principles and features described herein will be apparent to those skilled in the art. Thus, the present embodiment is not intended to be limited to the embodiments shown, but is to be accorded the widest scope consistent with the principles and features described herein.

Figure 1:
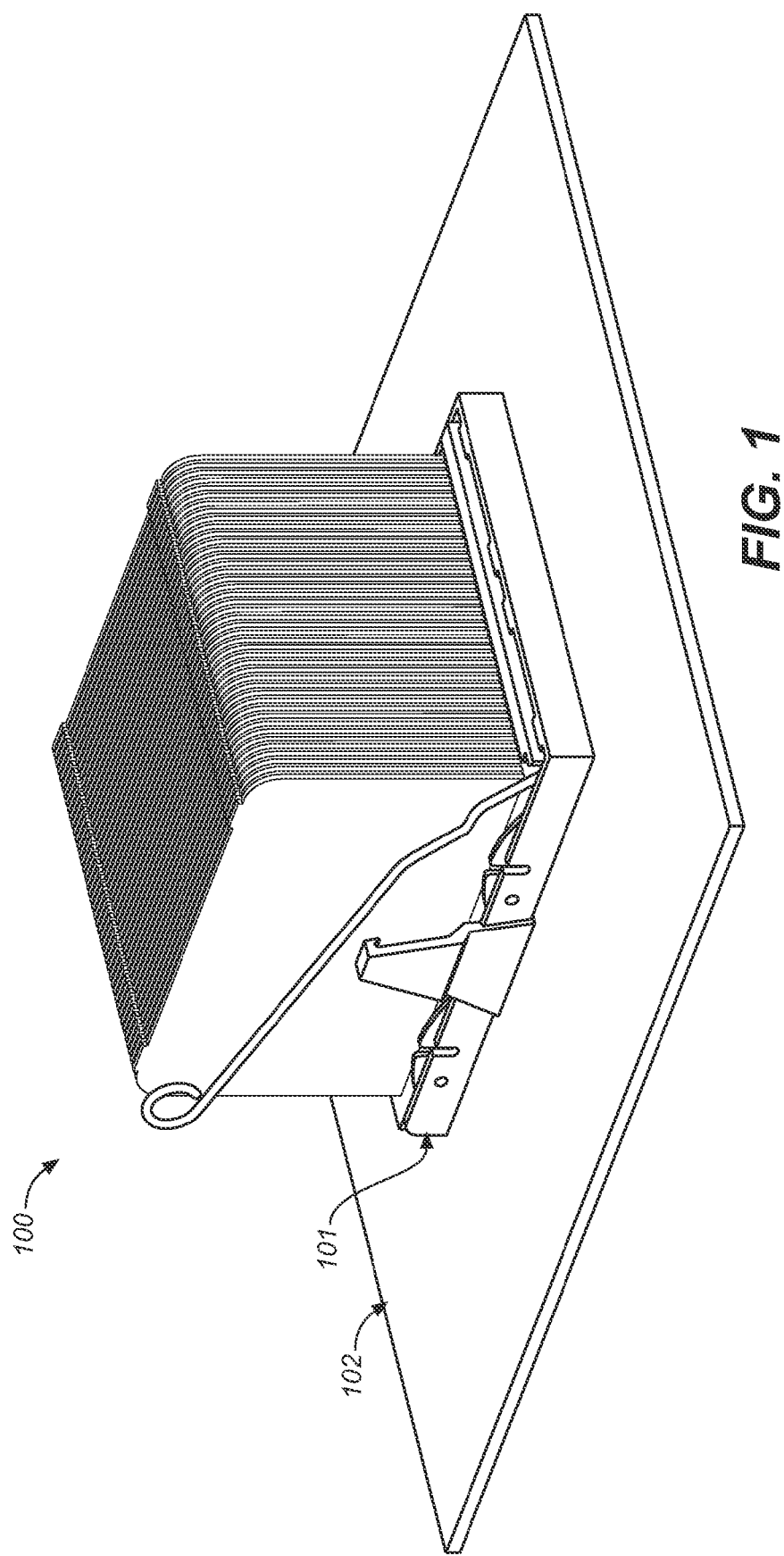
FIG. 1 shows a perspective view of a heat dissipation assembly including a heat sink, a retention module, and a printed circuit board, according to an embodiment.

FIG. 1 shows a perspective view of a heat dissipation assembly 100 ("assembly 100") including a retention module 101, mounted to a printed circuit board 102. The assembly 100 may be utilized for example within a computing system to remove or dissipate heat therefrom. For example, the assembly 100 may be mounted above a CPU, memory, or other electronic device such that when electronic device generate heat, the heat can be removed therefrom to maintain the functional integrity of the device.

Figure 2:
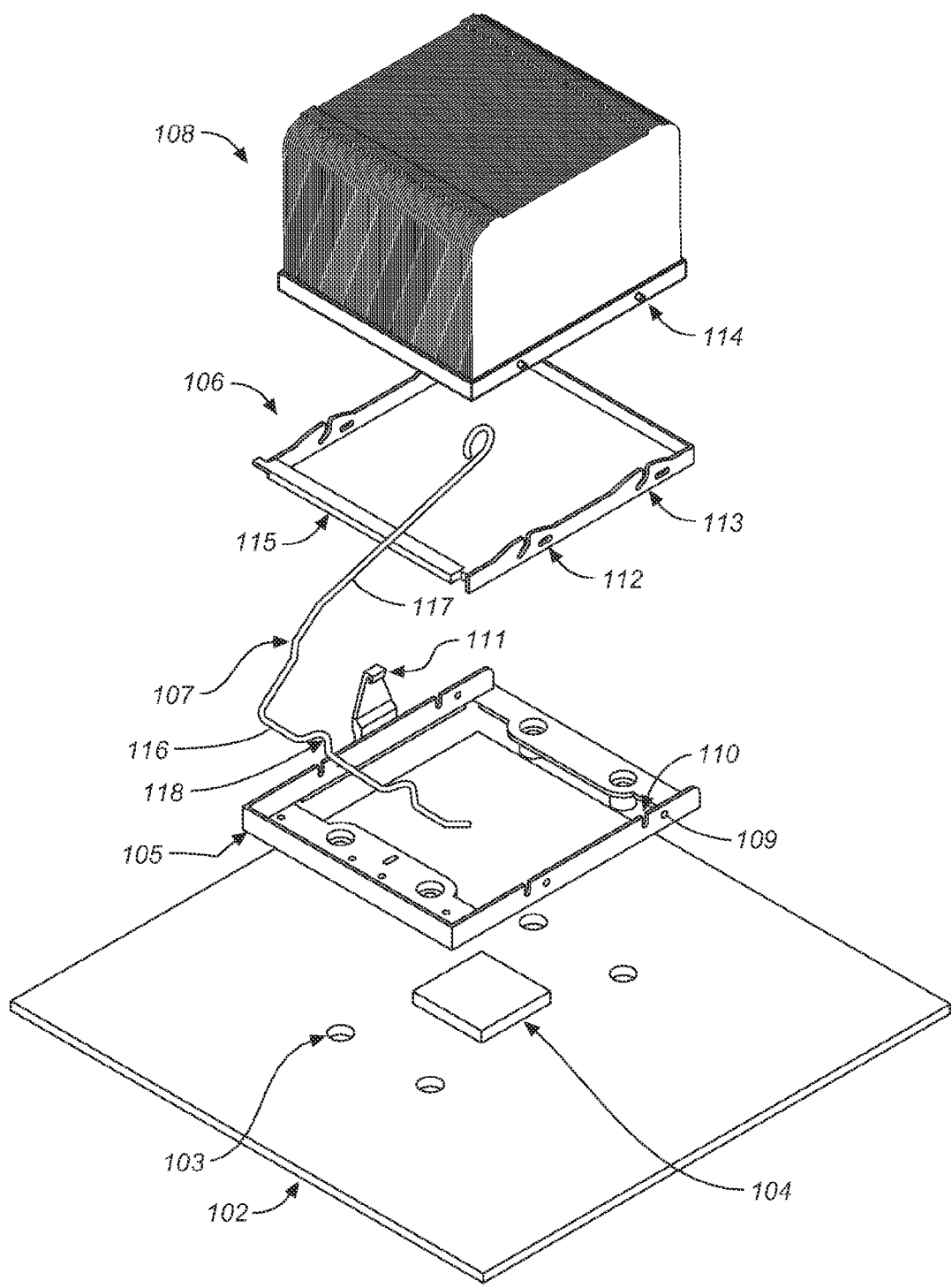
FIG. 2 shows an exploded view of a heat dissipation assembly including a heat sink, an internal member of the retention module, an external member of the retention module, a printed circuit board having an electronic device mounted thereto and a plurality of pins, inserts, slots, and other parts of the components listed above.

FIG. 2 shows an exploded view of the assembly 100 above the surface of the printed circuit board 102 having a plurality of openings 103, with an electronic device 104 mounted thereto. As shown, an external member 105 of the retention module 101 is disposed above the printed circuit board 102 and aligned such that the external member can be bolted thereto at openings 103. The external member 105 may include a plurality of inserts 109 (and a plurality of insert pins insertably coupled within the plurality of inserts 109—shown later in FIG. 5) and a plurality of vertical slots 110. Furthermore, a latch 111 is fixed to the perimeter of the external member 105.

Next, a lever 107 is shown in the exploded view of the assembly 100. For an embodiment, the lever 107 may comprise a single wire module having a first arm 116 which functions as a handle and a second arm 117, which includes a plurality of cam members 118.

The retention module 101 also includes an internal member 106 as shown above external member 105 in FIG. 2. The internal member 106 is utilized within the assembly 100 to house the heat dissipation component of the assembly. When the heat sink assembly 100 is assembled, as shown in FIG. 1, the internal member 106 is enclosed within the external member 105. The internal member 106 also includes a plurality of horizontal slots 112 and a plurality of angled slots 113. For an embodiment, the aforementioned slots may be used to couple the internal member 106 to the external member 105 and to facilitate motion of the heat sink 108 within the assembly 100.

As shown in FIG. 2, the heat sink 108 is shown above the internal member 106. For an embodiment, the heat sink 108 is the sole component within the heat sink assembly 100 that removes and/or dissipates heat generated from an electronic device. The heat sink 108 also includes a plurality of pins 114, which rests within the angled slots 113 when the heat sink 108 is seated within the internal member 106.

Figure 3:
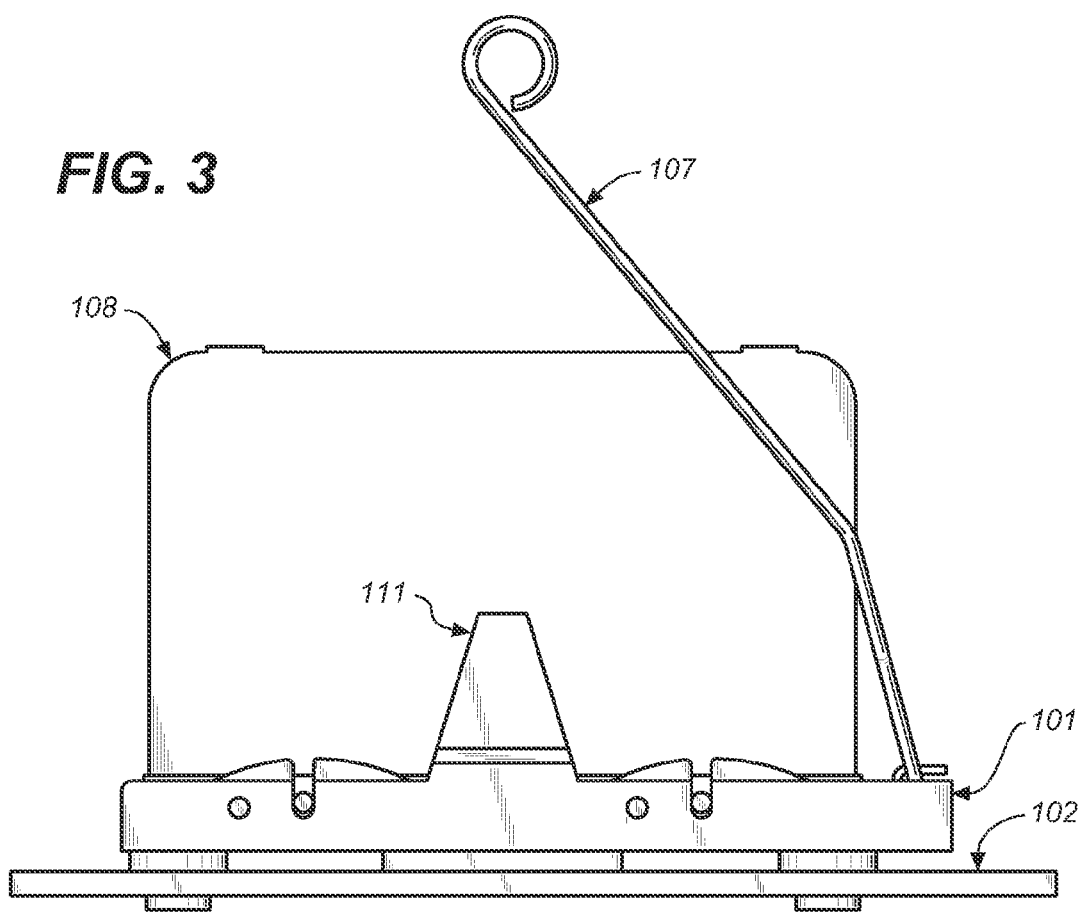
FIG. 3 shows a perspective view of a heat dissipation assembly in a load position, according to an embodiment.

The assembly 100 may be adjustable between a load position and a lock position. For example, FIG. 3 shows an illustration when the assembly 100 is in the load position. In particular, when the assembly 100 is in the load position, the lever 107 is not coupled to or locked by the latch 111. While the assembly 100 is in the load position, the heat sink 108 can be easily removed from the retention module 101.

Figure 4:
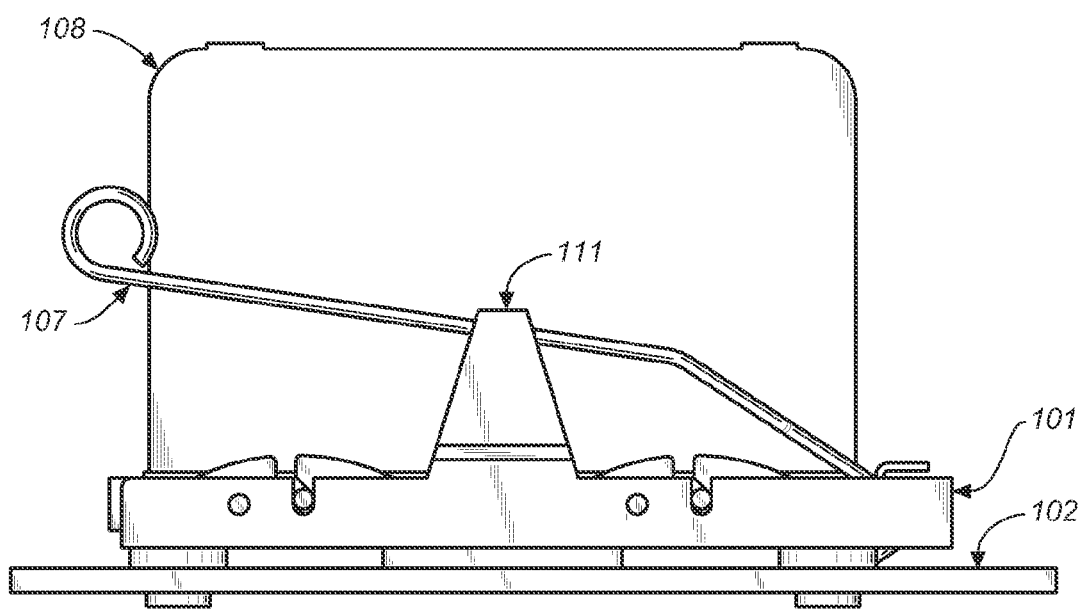
FIG. 4 shows a perspective view of a heat dissipation assembly in a locked position, according to an embodiment.

The assembly 100 may also be moved to a lock position, as shown in FIG. 4. As shown, when the assembly 100 is in the lock position, the lever 107 is coupled to and held by the latch 111. For an embodiment, while the assembly 100 is in the lock position, the heat sink 108 is held secure within the retention module 100. To secure the heat sink 108 within the retention module 100, the lever applies a force orthogonal to the top of each plurality of pins 114 of heat sink 108.

For an embodiment, a force is applied orthogonal to each of the plurality of pins 114 at the point contact between the pins 114 internal member 106, with force components in the horizontal and vertical direction. The force component in the horizontal direction is canceled by the force delivered to the pins 114 from the external member 105. For the embodiment, this force is orthogonal to the pins 114 at the point of contact between the pin and the external member 105, equal and opposite to the horizontal force component from the internal member 106, resulting in a downward force.

The amount of force applied by the lever upon a typical heat sink may range from 20 to 80 pounds in a downwards direction. Furthermore, when the assembly 100 is in the lock position, the heat sink 108 is cammed closer to the electronic device as the electronic device 104 is shown in FIGS. 1 and 2. Accordingly, when the assembly 100 is in the lock position, the heat sink 108 is clamped in proximity to the electronic device to more effectively dissipate heat generated by electronic device.

Figure 5:
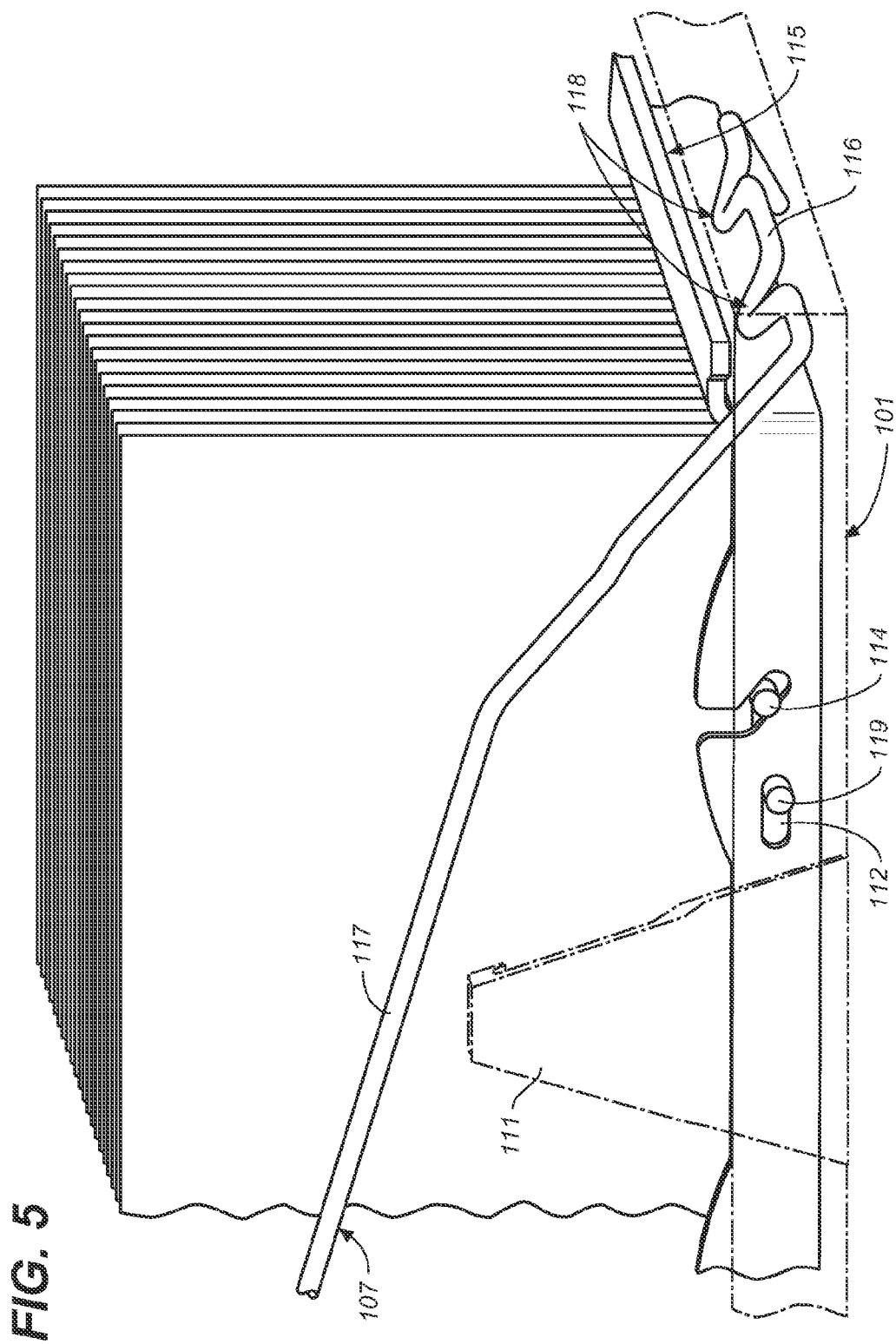
FIG. 5 shows a side view of a retention module including a lever having a plurality of cam members that cam the internal member forward when the lever is moved to a locked position, according to an embodiment.

The assembly 100 is designed such that the components therein cooperate in unison when the assembly 100 moves from one position to another. For example, FIG. 5 shows a view of the retention module 101 as the lever 107 moves from the load position to the lock position. As shown, the first arm 116 of lever 107 rotates such that the cam members 118 cam and apply a force to the backend 115 of the internal member 106. As the cam members 118 cam the backend 115 of the internal member 106, the internal member 106 is driven in a direction in line with that of the force applied by the cam members 118 to cause the internal member to apply a downward force on the heat sink in a first direction.

The heat sink 108 moves as the assembly 100 moves from the load position to the lock position and vice versa. For an embodiment, the heat sink 108 moves in a downwards direction when the assembly moves to the lock position, thereby bringing the heat sink 108 in closer proximity to the electronic device.

The cam members 118 may be designed to any suitable shape known in the art which enables the cam members 118 to cam or push the internal member 106 when the first arm 116 component of the lever is rotated forward. For example, the cam members 118 may hay a triangular, polygonal, convex, or concave shape or the like. For the embodiment, the cam members 118 have a substantially concave shape.

The quantity of cam members 118 along the second arm 117 may vary according to a specific application. For example, the quantity of cam members 118 along the second arm 117 may range from one cam member to 3 cam members or more. For the embodiment shown in FIG. 5, two cam members 118 span along the second arm 117 to effectively cam the internal member forward 106 when the lever 107 is rotated in the direction of the latch 111.

Furthermore, when the assembly 100 moves from the load position to the lock position, each of the plurality of pins, inserts, and slots within the assembly 100 also travel cooperatively with each other to efficiently move the assembly 100 between the load and lock positions. For example, the plurality of pins 114 coupled to the heat sink 108 each travel in a downward direction within each of the plurality of vertical slots 110 as the assembly 100 moves to the lock position. Alternatively, when the assembly moves from the lock position to the load position, each of the plurality of pins 114 travel in the opposite direction (upwards) within each of the plurality of vertical slots 110.

Additionally, as the internal member 106 moves forward, each plurality of horizontal slots 112 of the internal member 106 slides along the plurality of insert pins 119 For the embodiment shown in FIG. 5, the plurality of insert pins 119 couple the external member 105 and the internal member 106 together. Furthermore, the insert pins 119 function as a guide for the internal member 106 along the external member 105 as the assembly 100 moves from the load position to the lock position and vice versa.

It is an advantage of a method and system in accordance with the present invention to provide a heat dissipation assembly that provides a force to a heat sink/processor interface in a tool-less manner.

It is another advantage of a method and system in accordance with the present invention to provide a heat dissipation assembly that is operable by a single hand of an user.

It is yet another advantage of a method and system in accordance with the present invention to provide a retention module within a heat dissipation assembly that can be set in a load and lock position.

Although the present embodiment has been described in accordance with the embodiments shown, one having ordinary skill in the art will readily recognize that there could be variations to the embodiments and those variations would be within the spirit and scope of the present embodiment. Accordingly, many modifications may be made by one having ordinary skill in the art without departing from the spirit and scope of the appended claims.

The invention claimed is:

1. A retention module, comprising:
an external member;
an internal member enclosed within the external member, wherein the internal member is adaptable to seat a heat sink; and
a lever coupled to the external member, wherein the lever includes a cam member wherein when the lever engages in a first position, the cam member drives the internal member forward to cause the internal member to apply a downward force on the heat sink in a first direction.

2. The retention module of claim 1, further comprising a first plurality of slots on the perimeter of the external member and a second plurality of slots on the perimeter of the internal member.

3. The retention module of claim 2, wherein the first plurality of slots includes a plurality of inserts and a plurality of insert pins are each insertably coupled within the plurality of inserts.

4. The retention module of claim 2, wherein the second plurality of slots includes a plurality of angled slots and a plurality of horizontal slots.

5. The retention module of claim 2, wherein the first plurality of slots includes four vertical slots and four inserts.

6. The retention module of claim 2, wherein the second plurality of slots includes four angled slots and four horizontal slots.

7. The retention module of claim 1, further comprising a latch fixed to the external member, the latch locks the lever when the retention module is in a lock position.

8. The retention module of claim 1, wherein the lever includes a wire module.

9. The retention module of claim 1, wherein the first direction is a downwards direction.

10. A heat dissipation assembly, comprising:
a frame having an external member and an internal member enclosed within the external member,
a heat sink seated within the internal member, and
a lever coupled to the external member, the lever including a cam member wherein when the lever moves to a first position, the cam member pushes the internal member forward to cause the internal member to apply a downward force on the heat sink in a first direction and when the lever moves to a second position, the cam member pushes the internal member in a second direction.

11. The heat dissipation assembly of claim 10, wherein the external member includes a first plurality of slots and the internal member includes a second plurality of slots.

12. The heat dissipation assembly of claim 11, wherein the heat sink includes a plurality of pins.

13. The heat dissipation assembly of claim 12, wherein the plurality of pins are insertably coupled within the first plurality of slots and within the second plurality of slots.

14. The heat dissipation assembly of claim 12, wherein the plurality of pins includes four pins.

15. The heat dissipation assembly of claim 10, wherein when the lever moves to a lock position, the heat sink travels in a third direction orthogonal to the first direction and when the lever moves to a load position, the heat sink travels in a fourth direction opposite that of the third direction.

16. The heat dissipation assembly of claim 15, wherein the first direction and the second direction each are selected from a group comprising frontwards and backwards horizontal directions and the third direction and the fourth direction each are selected from a group comprising upwards and downwards vertical directions.

17. The heat dissipation assembly of claim 10, wherein the lever applies a force to the heat sink in a range from 20 to 80 pounds when the lever is in a lock position.

18. The heat dissipation assembly of claim 10, further comprising a printed circuit board wherein the heat dissipation assembly is mounted thereto.

19. A heat dissipation assembly, comprising:
a frame having an external member and an internal member enclosed within the external member, the external member having a plurality of vertical slots and a plurality of inserts including a plurality of first pins each insertably coupled within the plurality of inserts and the internal member having a plurality of angled slots and a plurality of horizontal slots, wherein the external member and the internal member are coupled together by insertably coupling each of the first plurality of pins through the plurality of horizontal slots;
a heat sink seated within the internal member, the heat sink having a plurality of second pins that fit within the plurality of vertical slots and within the plurality of angled slots;
a lever coupled to the external member, the lever including a cam member wherein when the lever engages in a lock position, the cam member pushes the internal member in a first direction and the heat sink is moved closer to a surface and when the lever is in a load position, the cam member pushes the internal member in a second direction and the heat is moved further from the surface; and
a latch coupled to the external member, the latch retains the lever when the lever is in a lock position, wherein the lever applies a force to the heat sink when the lever is in a lock position.

20. The heat dissipation assembly of claim 19, wherein the surface is a printed circuit board and wherein the heat dissipation assembly is mounted thereto.

21. The heat dissipation assembly of claim 20, wherein an electronic device is coupled to the surface and the heat sink is in contact with the electronic device when the lever is in a lock position.

22. The heat dissipation assembly of claim 19, wherein the lever includes a wire module.

\* \* \* \* \*